(12) United States Patent
Fujita et al.

(10) Patent No.: US 7,518,217 B2
(45) Date of Patent: Apr. 14, 2009

(54) SEMICONDUCTOR DEVICE, SEMICONDUCTOR WAFER, CHIP SIZE PACKAGE, AND METHODS OF MANUFACTURING AND INSPECTION THEREFOR

(75) Inventors: Harumitsu Fujita, Hamamatsu (JP); Masaharu Sasaki, Okuchi (JP)

(73) Assignee: Yamaha Corporation, Shizuoka-Ken (JP)

( * ) Notice: Subject to any disclaimer, the term of this patent is extended or adjusted under 35 U.S.C. 154(b) by 0 days.

(21) Appl. No.: 11/270,334

(22) Filed: Nov. 9, 2005

(65) Prior Publication Data
US 2006/0113637 A1 Jun. 1, 2006

(30) Foreign Application Priority Data
Nov. 11, 2004 (JP) ............................ P2004-327784
Feb. 28, 2005 (JP) ............................ P2005-052988

(51) Int. Cl.
*H01L 23/544* (2006.01)
*H01L 21/66* (2006.01)
*H01L 21/00* (2006.01)

(52) U.S. Cl. ............... 257/620; 257/678; 257/E23.179; 257/E21.521; 438/14; 438/462

(58) Field of Classification Search ................ 257/620, 257/678, E23.179, E21.521, E21.523; 438/460, 438/462, 14
See application file for complete search history.

(56) References Cited

U.S. PATENT DOCUMENTS

| 5,703,381 A | 12/1997 | Iwasa et al. |
| 5,933,351 A | 8/1999 | Balamurugan et al. |
| 6,219,910 B1 | 4/2001 | Murali |
| 6,300,224 B1 | 10/2001 | Arima et al. |
| 6,303,470 B1 | 10/2001 | Ohsumi et al. |
| 6,303,944 B1 * | 10/2001 | Sakai et al. ................... 257/48 |
| 6,337,258 B1 | 1/2002 | Nakayoshi |
| 6,420,245 B1 * | 7/2002 | Manor ........................ 438/460 |
| 6,462,401 B2 * | 10/2002 | Fujii ........................... 257/620 |
| 6,555,447 B2 * | 4/2003 | Weishauss et al. .......... 438/460 |
| 6,583,383 B2 | 6/2003 | Higashi |
| 6,635,512 B1 | 10/2003 | Hikita et al. |
| 6,656,819 B1 | 12/2003 | Sugino |

(Continued)

FOREIGN PATENT DOCUMENTS

JP        09-252027        9/1997

(Continued)

*Primary Examiner*—Tuan N. Quach
(74) *Attorney, Agent, or Firm*—Dickstein Shapiro LLP

(57) ABSTRACT

A semiconductor wafer is manufactured in such a way that a main surface of a semiconductor substrate is partitioned into a plurality of semiconductor element forming regions defined by scribing regions, wherein at least one pattern for measuring a width of a cut region and its positional shift is formed in proximity to a peripheral portion of the semiconductor substrate on a scribing line. The pattern is constituted by a plurality of micro patterns that are aligned in a reverse V-shape to traverse the scribing line and a pair of elongated patterns that partially overlap seal rings formed in both sides of the scribing line. It is possible to form a channel whose width is larger than the width of the cut region on the backside of the semiconductor substrate in correspondence with the scribing region in order to avoid the formation of chipping, cracks, and burrs during cutting.

33 Claims, 10 Drawing Sheets

U.S. PATENT DOCUMENTS

| | | | |
|---|---|---|---|
| 6,713,843 | B2 | 3/2004 | Fu |
| 6,768,332 | B2 | 7/2004 | Lin et al. |
| 6,803,247 | B2 | 10/2004 | Sekiya |
| 6,828,071 | B2 | 12/2004 | Nin |
| 2003/0190795 | A1 | 10/2003 | Kawakami |
| 2005/0003635 | A1 | 1/2005 | Takekoshi |
| 2005/0199995 | A1 * | 9/2005 | Nomoto et al. ............. 257/692 |

FOREIGN PATENT DOCUMENTS

| | | |
|---|---|---|
| JP | 11-111896 | 4/1999 |
| JP | 11-219922 | 8/1999 |
| JP | 2000-124168 | 4/2000 |
| JP | 2000-195862 | 7/2000 |
| JP | 2001-085363 | 3/2001 |
| KP | 1994-0004993 | 6/1994 |
| KP | 1999-0069824 | 9/1999 |
| TW | 347555 | 12/1998 |
| TW | 363238 | 7/1999 |
| TW | 444368 | 7/2001 |
| TW | 454304 | 9/2001 |
| TW | 476141 | 2/2002 |
| TW | 478058 | 3/2002 |
| TW | 481893 | 4/2002 |
| TW | 487981 | 5/2002 |
| TW | 529095 | 4/2003 |
| TW | 529097 | 4/2003 |
| TW | 541642 | 7/2003 |
| TW | 200303601 | 9/2003 |
| TW | 200308055 | 12/2003 |
| TW | 200403736 | 3/2004 |
| TW | 591237 | 6/2004 |
| TW | 1222173 | 10/2004 |

* cited by examiner

*FIG.11*
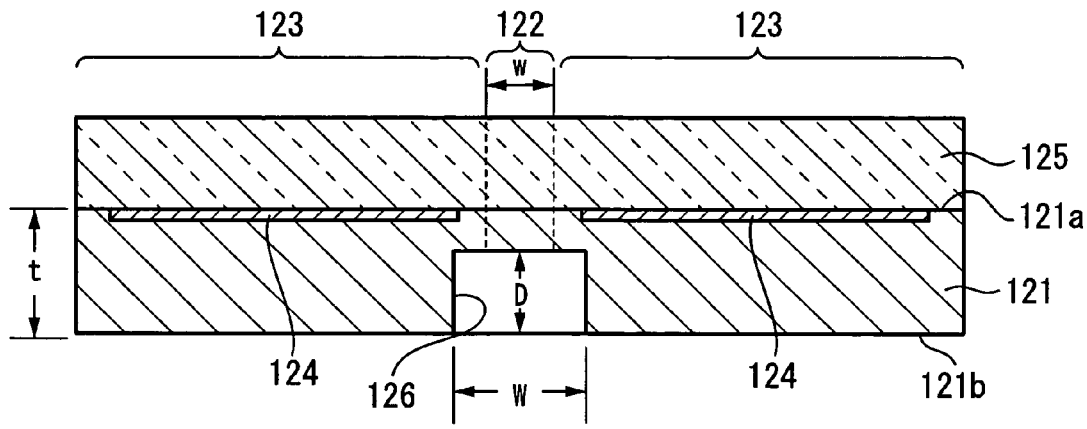
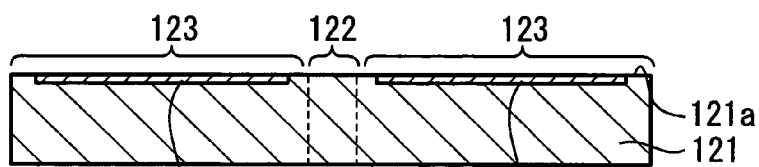
*FIG.12A*
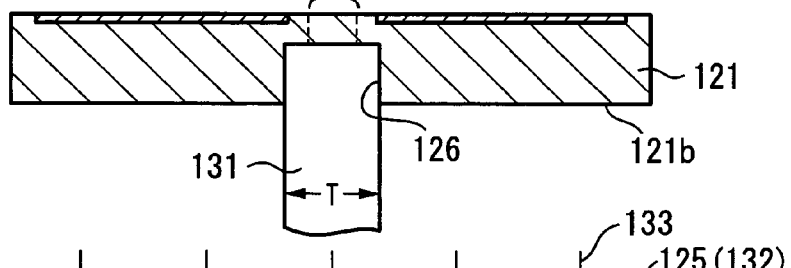
*FIG.12B*
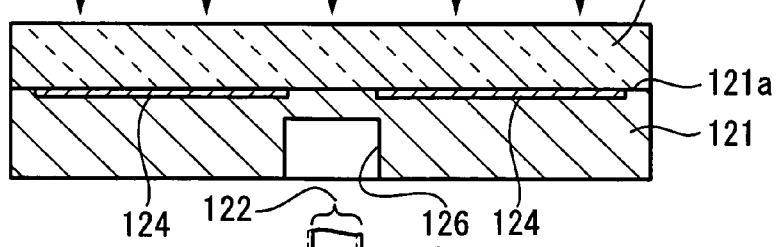
*FIG.12C*
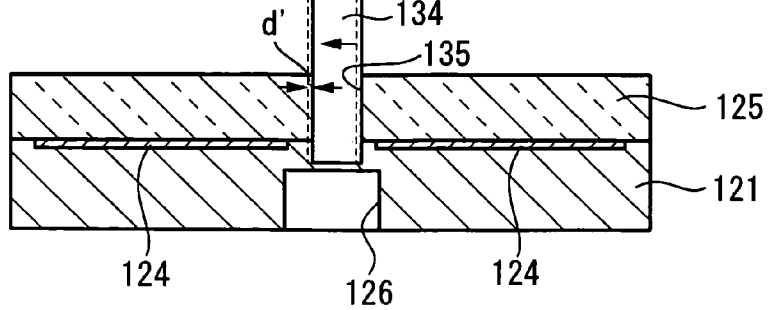
*FIG.12D*

US 7,518,217 B2

SEMICONDUCTOR DEVICE, SEMICONDUCTOR WAFER, CHIP SIZE PACKAGE, AND METHODS OF MANUFACTURING AND INSPECTION THEREFOR

BACKGROUND OF THE INVENTION

1. Field of the Invention

This invention relates to semiconductor devices, semiconductor wafers, chip size packages (CSP), and wafer level chip size packages (WLCSP). This invention also relates to manufacturing methods and inspection methods for semiconductor wafers.

This application claims priority on Japanese Patent Applications Nos. 2004-327784 and 2005-52988, the contents of which are incorporated herein by reference.

2. Description of the Related Art

Recently, electronic devices such as notebook personal computers and portable telephones having digital cameras have been rapidly developed so as to reduce dimensions, thickness, and weights thereof, whereby conventionally-known dual inline packages have been replaced with chip size packages encapsulating semiconductor devices.

Various types of semiconductor devices encapsulated in chip size packages have been developed and put into practical use; and Japanese Unexamined Patent Application Publication No. H09-252027 discloses an example of a semiconductor device encapsulated in a chip size package. Herein, an integrated circuit is formed on the surface of a semiconductor substrate and is covered with a resin sealing layer.

Semiconductor devices of chip size packages are produced in such a way that a semiconductor wafer having a plurality of integrated circuits, which are formed on the surface in a lattice-like manner and are each encompassed by scribing regions, are subjected to dicing (or cutting) using a dicing blade along scribing lines, thus separating individual semiconductor chips.

FIG. 9 is a cross-sectional view showing the structure of a conventionally-known semiconductor wafer in proximity to a dicing line (or a cut region) after dicing, wherein reference numeral 1 designates a silicon substrate; reference numeral 2 designates a field oxide film that is formed on a main surface 1a of the silicon substrate 1; reference numerals 3a to 3c designate first, second, and third interlayer insulating films that are formed separately formed on the field oxide film 2; reference numerals 4a to 4c designate seal rings that are separately formed above an opening 2a of the field oxide film 2; reference numeral 5 designates a passivation film that covers the third interlayer insulating film 3c and the sealing ring 4c; reference numeral 6 designates a scribing line (or a scribing region); reference numeral 7 designates a chip region (i.e., a region for use in the formation of components of a semiconductor device); and reference numeral 8 designates a dicing line (or a cut region).

In a dicing step, a width w of the dicing line 8 and a width W of the scribing line 6 are respectively set in such a way that a positional shift s, by which a center axis Ax' of the dicing line 8 shifts from a center axis Ax of the scribing line 6, converges into a regular range. For example, when the width w of the dicing line 8 is set to 50 μm, the width W of the scribing line 6 is set to approximately 100 μm.

FIG. 10 is a plan view showing the layout of the conventionally-know semiconductor wafer after the dicing step, wherein reference numerals 11 designate individual semiconductor chips that are separated by the dicing lines 8; and reference numerals 12 designate solder balls that are formed in a matrix manner in each of the semiconductor chips 11, wherein the solder balls 12 are electrically connected to integrated circuits (not shown) that are formed on the main surface 1a of the silicon substrate 1.

There is a possibility of the occurrence of degradation of ones of the semiconductor chips 11 in which the dicing lines 8 exceed prescribed allowance due to positional shifts in dicing and partially extend into the chip regions 7, thus causing damage to the seal rings 4a to 4c. Such damage of the seal rings 4a to 4c makes it easy for the water content in the air to infiltrate into internal regions of the semiconductor chips 11. This becomes a factor in degrading the reliability in manufacturing over time; hence, it is necessary for the manufacturer to perform inspections.

There are provided two inspection methods as follows:

(1) First Inspection Method

In FIG. 10, distances $t_1$ and $t_2$ between each solder ball 12 and rectangular ends 13 and 14 of each semiconductor chip 11; then, a distance d between the seal ring 4c and the dicing line 8 is calculated based on the distances $t_1$ and $t_2$.

(2) Second Inspection Method

With respect to each product lot, a prescribed number of semiconductor chips 11 are extracted and are then subjected to damaging at peripheral portions thereof, thus directly measuring the distance d between the seal ring 4c and the dicing line 8.

In each of the aforementioned inspection methods, it is judged that damage may be unlikely to occur when the distance d belongs to a regular range, so that the corresponding product lot is judged to be a good product. In contrast, when the distance d exceeds the regular range, it is judged that damage may likely occur, so that the corresponding product lot is judged to be a defective product.

As for the first inspection method, the distances $t_1$ and $t_2$ between the solder balls 12 and the rectangular ends 13 and 14 of the semiconductor chip 11 are relatively long and are measured based on the positioning of the solder balls 12 that are arranged with a relatively low precision of patterning; hence, the measurement precision for the distances $t_1$ and $t_2$ becomes low. For this reason, there is a drawback in that the precision for the calculation of the distance d between the seal ring 4c and the dicing line 8 becomes low because of the low measurement precision for the distances $t_1$ and $t_2$. In addition, the first inspection method requires a specially-designed device for measuring the distances $t_1$ and $t_2$, which is troublesome.

The second inspection method directly measures the distance d between the seal ring 4c and the dicing line 8; hence, the measurement precision for the distance d becomes high; however, it takes a long time and requires troublesome work to perform the inspection. In addition, the second inspection method is a so-called destructive inspection; hence, after the inspection, the semiconductor chips become useless.

In order to avoid the occurrence of curvature and crack in semiconductor substrates during dicing, it may be necessary for silicon wafers to have structures including the following technical features.

(1) Channels are formed in conformity with boundaries between integrated circuits on the backside of a silicon substrate by use of a dicing blade; thereafter, the surface of the silicon substrate is sealed with a resin and is then subjected to cutting along the channels by use of the dicing blade, thus producing individual chip size packages, an example of which is disclosed in Japanese Unexamined Patent Application Publication No. 2000-124168.

(2) Channels having rectangular shapes in cross sections or V-shaped channels are formed in scribing regions on the surface of a silicon substrate; then, the overall surface of the silicon substrate including the channels is sealed with a resin, thus completing a silicon wafer. The surface of the silicon substrate is subjected to cutting along the rectangular channels or the V-shaped channels by use of a dicing blade having a reduced thickness, thus producing chip size packages, examples of which are disclosed in Japanese Unexamined Patent application Publication No. 2000-195862 and Japanese Unexamined Patent Application Publication No. H11-111896.

(3) Channels having relatively large widths are formed in scribing regions on the surface of a silicon substrate; then, the surface of the silicon substrate including the channels is sealed with a resin, thus completing a silicon wafer. Thereafter, the backside of the silicon substrate is subjected to polishing (or grinding) so that the broad channels are exposed on the backside of the silicon substrate; then, the surface of the silicon substrate is subjected to cutting along the channels, thus producing chip size packages, an example of which is disclosed in Japanese Unexamined Patent Application Publication No. 2001-85363.

FIG. 18 is a cross-sectional view showing a silicon wafer having the aforementioned structure (1), wherein reference numeral 101 designates a silicon substrate; reference numeral 102 designates a scribing region on a main surface 101a of the silicon substrate 101; reference numerals 103 designate integrated circuit forming regions defined by the scribing region 102; reference numerals 104 designate integrated circuits that are formed in the integrated circuit forming regions 103 respectively; reference numeral 105 designates a resin sealing layer for entirely covering the main surface 101a including the integrated circuits 104; and reference numeral 106 designates a boundary channel that is formed at a prescribed position on a backside 101b of the silicon substrate 101 in conformity with the scribing region 102.

The boundary channel 106 is formed using a dicing blade whose thickness is approximately set to 100 µm.

When a chip size package is produced using the aforementioned silicon wafer, the surface of the resin sealing layer 105 and the surface 101a of the silicon substrate 101 is subjected to cutting along the boundary channel 106 by use of the aforementioned dicing blade.

When a chip size package is produced using the silicon wafer having the aforementioned structure (1), the surface 101a of the silicon substrate 101 are subjected to cutting by use of the dicing blade whose thickness substantially matches the width of the scribing region 102. As shown in FIG. 19, a dicing channel 112, which is formed by cutting the surface 101a by use of a dicing blade 111, may deviate from the boundary channel 106 on the backside 101b with a positional shift d therebetween. After completion of dicing, this may cause chipping (or shell-like cracks) 113, cracks 114, and burrs 115 in a certain portion interconnecting the dicing channel 112 and the boundary channel 106 in the silicon substrate 101.

Problems due to the occurrence of the chipping 113, cracks 114, and burrs 115 may occur in the other silicon wafers having the aforementioned structures (2) and (3) as well; hence, it seems that they are common in all wafers for use in manufacturing of chip size packages.

SUMMARY OF THE INVENTION

It is an object of the present invention to provide a semiconductor device, a semiconductor wafer, and a chip size package, in which individual semiconductor chips are separated by cutting along scribing lines by use of a cutting tool such as a dicing blade.

It is another object of the present invention to provide an inspection method in which a cut width and a positional shift of a scribing line set for a semiconductor wafer can be measured with high precision without using a specially-designed measurement device.

It is a further object of the present invention to provide a semiconductor device, a semiconductor wafer, and a wafer level chip size package, in which it is possible to prevent chipping, cracks, and burrs from occurring in the periphery of semiconductor chips during dicing.

In a first aspect of the present invention, there is provided a semiconductor wafer in which a main surface of a semiconductor substrate is partitioned into a plurality of semiconductor element forming regions defined by scribing regions and which includes at least one pattern for measuring a width of a cut region and its positional shift when the semiconductor substrate is subjected to cutting along the scribing regions. The pattern represents a linearly symmetrical figure, for example, and is formed in proximity to a peripheral portion of the main surface of the semiconductor substrate and can be further extended over the scribing region. This contributes to effective use of the peripheral portion of the main surface of the semiconductor wafer, which is conventionally regarded as a useless area; hence, it is unnecessary to enlarge the semiconductor wafer and semiconductor element forming regions in order to form the pattern. In addition, it is possible to apply identification information including a numerical value or a character to the pattern.

A semiconductor device is produced including a semiconductor element (corresponding to an integrated circuit) that is extracted from the aforementioned semiconductor wafer, wherein by observing the pattern, it is possible to directly measure the width of the cut region and its positional shift; hence, it is possible to improve measurement precision and to reduce time required for inspection. The semiconductor device can be realized using a chip size package encapsulating the semiconductor element. Since no trouble may occur in the cut region regarding the semiconductor element, it is possible to improve electric characteristics and reliability with respect to the chip size package. In addition, it is possible to improve yield in manufacturing products, which can thus be reduced in cost.

The aforementioned semiconductor wafer is manufactured by implementing a pattern forming step for forming a pattern that is used to measure a width of a cut region and its positional shift when the semiconductor substrate is subjected to cutting along the scribing regions, wherein the pattern forming step is implemented during or after a semiconductor element forming step for forming semiconductor elements in the semiconductor element forming regions on the semiconductor wafer. This manufacturing method can be realized with ease by slightly modifying the conventionally-known manufacturing process of the semiconductor wafer, wherein the aforementioned pattern can be easily formed without causing any delay in workability and without increasing the manufacturing cost. In addition, the semiconductor element forming step may include an external terminal forming step for forming external terminals, which are electrically connected to the semiconductor elements, so that the pattern forming step can be performed simultaneously with the external terminal forming step.

Furthermore, the aforementioned semiconductor wafer can be subjected to inspection in which by observing variations of the pattern before and after dicing of the semiconductor wafer along the scribing regions, it is possible to perform an evaluation as to whether or not the dicing is being performed well. The inspection can be performed visually and with ease and does not necessarily require a skilled worker; hence, it is possible to realize an improvement in workability in manufacture and to reduce overall manufacturing cost.

In a second aspect of the present invention, a semiconductor wafer includes a plurality of integrated circuit forming regions that are defined by scribing regions and are formed on a main surface of a semiconductor substrate and are covered with a sealing layer composed of a polymer (or high molecular) compound, wherein a channel whose width is larger than a width of the scribing region is formed at a prescribed position in correspondence with the scribing region on a backside of the semiconductor substrate. In a cutting step using a cutting tool such as a dicing blade, it is possible to avoid the formation of chipping, cracks, or burrs due to the formation of the broad channel on the backside of the semiconductor substrate in correspondence with the scribing region, which is subjected to cutting. This improves reliability in manufacturing semiconductor devices, which are extracted from the semiconductor wafer and are separated from each other.

In the above, the channel has a bottom whose center has a maximal depth compared with side portions thereof. Specifically, the channel has a V-shaped bottom, a U-shaped bottom, or a bottom of a semi-circular shape in a cross section in a longitudinal direction. This further reduces the possibility regarding the formation of chipping, cracks, and burrs during cutting.

The width of the channel is larger than the width of a cut channel, which is formed in the scribing region in a cutting step, by a prescribed factor, which is 1.2 times or more and 1.4 times or less compared with the width of the cut channel. In addition, the maximal depth of the bottom of the channel is smaller than a thickness of the semiconductor substrate by a prescribed factor, which ranges from 20% to 70% compared with the thickness of the semiconductor substrate. Furthermore, the scribing region is subjected to cutting with a prescribed inclination angle in side portions thereof. A semiconductor device can be encapsulated in a wafer level chip size package that is produced using the aforementioned semiconductor wafer.

The aforementioned semiconductor device is manufactured by performing the following steps:

(i) A first step for forming a channel whose width is larger than a width of a scribing region at a prescribed position in correspondence with the scribing region on the backside of a semiconductor substrate.

(ii) A second step for forming a sealing layer composed of a polymer compound so as to entirely cover the main surface of the semiconductor substrate, thus encapsulating the integrated circuit forming regions therein.

(iii) A third step for cutting the semiconductor substrate and the sealing layer along the scribing regions, thus separating individual chips respectively including the integrated circuit forming regions.

In the manufacturing method, it is possible to produce semiconductor devices in which no chipping, cracks, or burrs are formed during cutting due to the provision of the broad channel on the backside of the semiconductor substrate; hence, it is possible to improve yield and reliability in manufacturing.

BRIEF DESCRIPTION OF THE DRAWINGS

These and other objects, aspects, and embodiments of the present invention will be described in more detail with reference to the following drawings, in which:

FIG. 11 is a cross-sectional view showing the structure of a silicon wafer in accordance with a second embodiment of the present invention;

FIG. 12A is a cross-sectional view showing a first step for manufacturing a wafer level chip size package in which integrated circuits are formed on the main surface of a silicon substrate;

FIG. 12B is a cross-sectional view showing a second step for manufacturing the wafer level chip size package in which a channel is formed on the backside of the silicon substrate by use of a dicing blade;

FIG. 12C is a cross-sectional view showing a third step for manufacturing the wafer level chip size package in which a resin sealing layer is formed upon ultraviolet radiation;

FIG. 12D is a cross-sectional view showing a fourth step for manufacturing the wafer level chip size package in which the resin sealing layer and silicon substrate are subjected to cutting along a scribing region by use of a dicing blade;

DESCRIPTION OF THE PREFERRED EMBODIMENTS

The present invention will be described in further detail by way of examples with reference to the accompanying drawings.

1. First Embodiment

Figure 1:
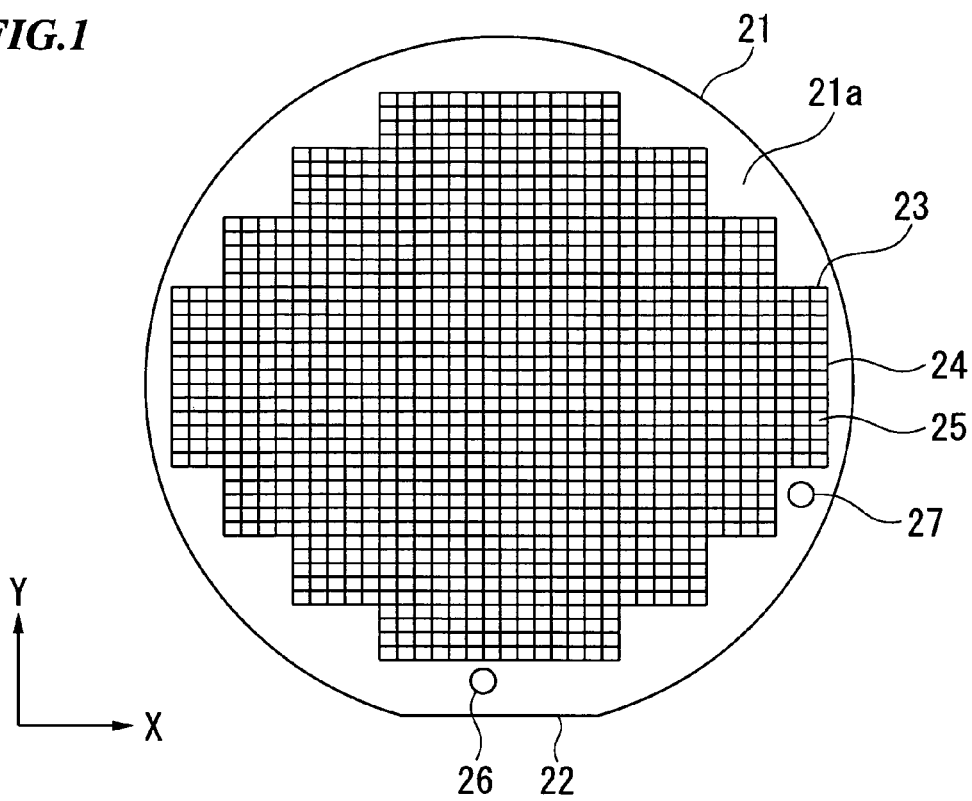
FIG. 1 is a plan view showing the layout of a silicon wafer in accordance with a first embodiment of the present invention.

FIG. 1 is a plan view showing the layout of a silicon wafer (i.e., a semiconductor wafer) in accordance with a first embodiment of the present invention, wherein reference numeral 21 designates a silicon substrate (or a semiconductor substrate); reference numeral 22 designates an orientation flat that is formed in proximity to the peripheral portion of the lower portion of the silicon substrate 21 in a Y-axis direction; reference numerals 23 designate scribing lines (or scribing regions) for the partitioning of band-like regions aligning in an X-axis direction on a main surface 21a of the silicon substrate 21; reference numerals 24 designate scribing lines (or scribing regions) for the partitioning of band-like regions aligning in the Y-axis direction on the main surface 21a of the silicon substrate 21; reference numerals 25 designate chip regions (or semiconductor element forming regions) that are partitioned by the scribing lines 23 and the scribing lines 24, which cross at right angles therebetween; reference numeral 26 designates a pattern that is formed in proximity to the peripheral portion of the lower portion on the main surface 21a of the silicon substrate 21 in the Y-axis direction and that is formed on the scribing line 24; and reference numeral 27 designates a pattern that is formed in proximity to the peripheral portion of the right-side portion on the main surface 21a of the silicon substrate 21 in the X-axis direction and that is formed on the scribing line 23.

Figure 2:
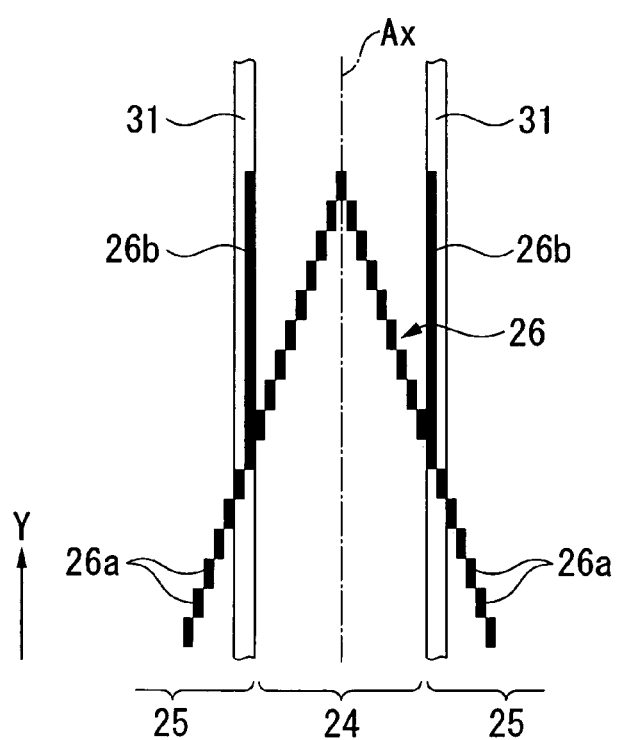
FIG. 2 is a plan view showing micro patterns that are formed with respect to a scribing line lying in a Y-axis direction in FIG. 1.

The pattern 26 is used to measure a width w of a cut region and its positional shift s with respect to the scribing line 24 at which the silicon substrate 21 is subjected to cutting by use of a cutting tool such as a dicing blade as shown in FIG. 2.

Specifically, a plurality of rectangular micro patterns 26a are formed in a reverse V-shape in a plan view to traverse the scribing line 24; and a pair of band-like elongated patterns 26b are respectively formed to partially overlap seal rings 31 of the chip regions 25, which are arranged at both sides of the scribing line 24. That is, two strings of the micro patterns 26a, which are aligned in a slanted manner, cross each other at a tip-end position, which matches a center axis Ax of the scribing line 24. In addition, the other ends of the two strings of the micro patterns 26a respectively run through the upper portions of the seal rings 31 and extend into the chip regions 25.

Figure 3:
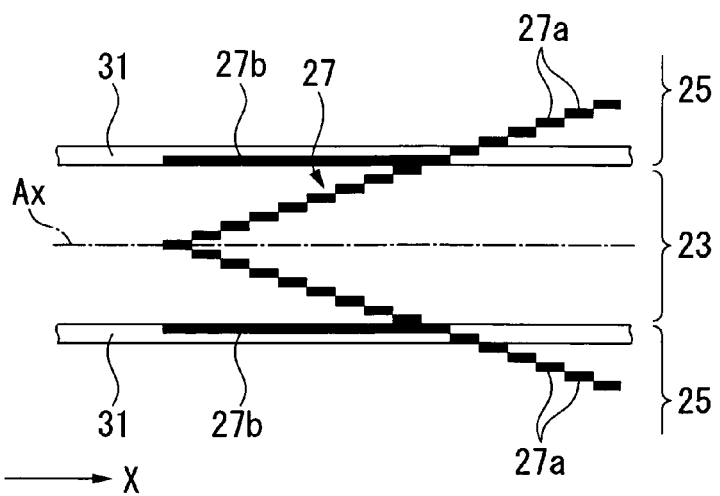
FIG. 3 is a plan view showing micro patterns that are formed with respect to a scribing line lying in an X-axis direction in FIG. 1.

As shown in FIG. 3, the pattern 27 substantially matches the aforementioned pattern 26, which is rotated by 90°, and is used to measure a width w of a cut region and its positional shift s with respect to the scribing line 23 at which the silicon substrate 21 is subjected to cutting by use of a cutting tool such as a dicing blade, wherein a plurality of rectangular micro patterns 27a are aligned in a reverse V-shape in a plan view; and a pair of band-like elongated patterns 27b are formed to overlap the seal rings 31 of the chip regions 25, which are arranged at both sides of the scribing line 23. That is, two strings of the micro patterns 27a, which are aligned in a slanted manner, cross each other at a tip-end position, which matches a center axis Ax of the scribing line 23. In addition, the other ends of the two strings of the micro patterns 27a run through the upper portions of the seal rings 31 and extend into the chip regions 25.

The aforementioned patterns 26 and 27 are formed at prescribed positions on the main surface 21a of the silicon substrate 21 during a step in which semiconductor elements such as integrated circuits are respectively formed in the chip regions 25 or in a pattern formation step after the foregoing step.

Specifically, these patterns 26 and 27 are simultaneously formed together with the formation of copper posts, which are composed of copper and which are electrically connected to semiconductor elements such as integrated circuits formed in the chip regions 25, or the formation of solder bumps, which are formed above the copper posts and whose upper ends are exposed, or the formation of solder electrodes corresponding to external electrodes of semiconductor elements.

Therefore, the patterns 26 and 27 can be formed by simply changing mask patterns. In addition, the present embodiment is advantageous because it does not require a special step for the formation of the patterns 26 and 27; hence, there is no risk of pushing up the manufacturing cost.

Next, an inspection method for the aforementioned silicon wafer will be described.

Before the dicing (or cutting) of the silicon substrate 21, the micro patterns 26a existing in the space defined between the elongated patterns 26b are aligned in a reverse V-shape symmetrically with respect to the center axis Ax of the scribing line 24.

Figure 4A:
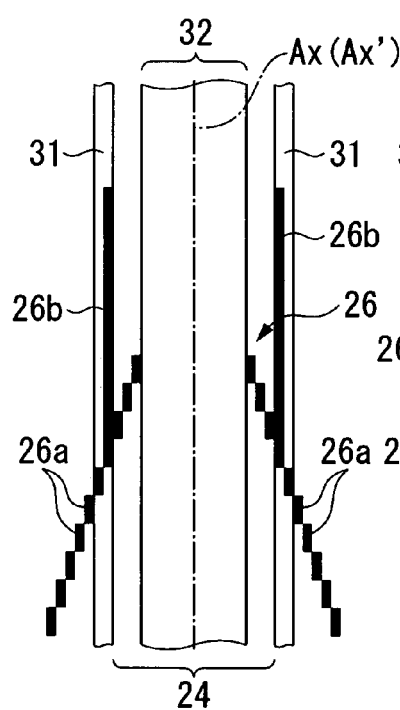
FIG. 4A shows an example of dicing in which micro patterns are left over symmetrically with respect to a dicing line.
Figure 4B:
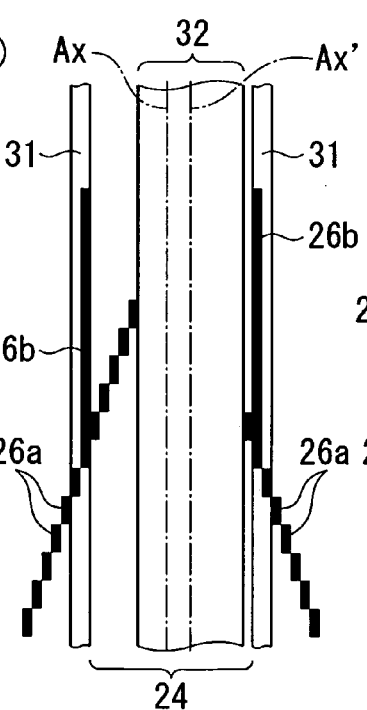
FIG. 4B shows another example of dicing in which micro patterns are left over asymmetrically with respect to a dicing line.
Figure 4C:
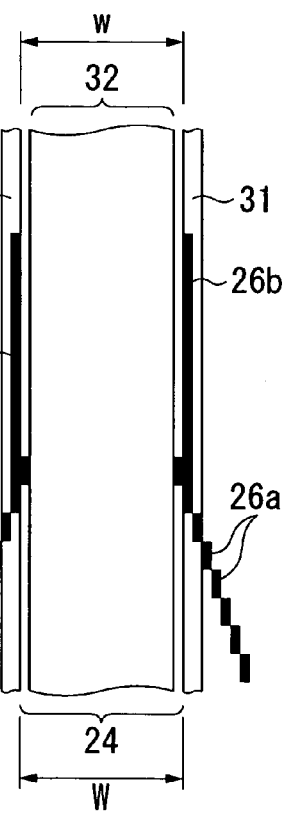
FIG. 4C shows a further example of dicing in which micro patterns are left over symmetrically with respect to a dicing line with very small distances apart from seal rings.

When the silicon substrate 21 is subjected to dicing using a cutting tool such as a dicing blade along the scribing line 24, a dicing line 32 may be formed to cut out a center portion of the pattern 26 so that some of the micro patterns 26 may remain on both sides thereof (see FIGS. 4A to 4C).

Suppose that as shown in FIG. 4A, the micro patterns 26a remain symmetrically on both sides of the dicing line 32, wherein the same distance lies between the sides ends of the dicing line 32 and the seal rings 31 respectively; in this case, the center axis Ax' of the dicing line 32 substantially matches the center axis Ax of the scribing line 24.

Suppose that the micro patterns 26a remain on both sides of the dicing line 32 as shown in FIG. 4B, the distance between the right side end of the dicing line 32 and the seal ring 31 becomes small, and the distance between the left side end of the dicing line 32 and the seal ring 31 becomes large; in this case, the center axis Ax' of the dicing line 32 deviates from the center axis Ax of the scribing line 24 by a positional shift s.

Suppose that the micro patterns 26 remain on both sides of the dicing line 32 as shown in FIG. 4C, wherein the same distance lies between the side ends of the dicing line 32 and the seal rings 32 respectively; in this case, the distance is very small so that the width w of the dicing line 32 becomes slightly smaller than the width W of the scribing line 24.

As described above, by observing the overall shape of the micro patterns 26a remaining on both sides of the dicing line 32, it is possible to perform evaluation as to whether or not dicing is being performed well. The observation can be performed visually with ease, and it does not necessarily require a skilled worker; hence, it is possible to make a determination as to whether or not dicing is being performed well along the scribing line 24. The aforementioned evaluation and determination can be realized speedily with ease. This brings an improvement in workability in manufacture and reduces overall manufacturing cost.

The aforementioned inspection is performed by directly and visually observing the overall shape of the micro patterns 26a remaining on both sides of the dicing line 32. That is, it is possible to directly measure the width w of the dicing line 32 and its positional shift s with high precision.

Similarly to with the pattern 26, it is possible to perform evaluation with respect to the quality of the dicing line in connection with the pattern 27.

The silicon wafer of the present embodiment is subjected to cutting along the scribing lines 23 and 24, which cross at a right angle therebetween, so as to separate individual chip regions 25 in which integrated circuits are formed. Thus, it is possible to produce chip size packages encapsulating individual chips.

These chips do not suffer from trouble regarding the dicing lines 32; hence, it is possible to remarkably improve electric characteristics and reliability with respect to chip size packages encapsulating chips, which are manufactured as described above.

The first embodiment can be modified in a variety of ways; hence, modifications will be described below.

(a) First Modification

Figure 5:
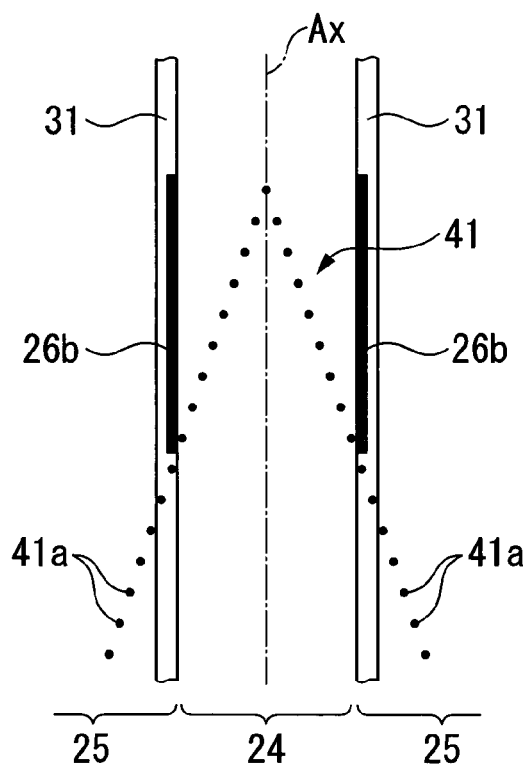
FIG. 5 is a plan view showing a prescribed part of the layout of a silicon wafer in accordance with a first modification of the first embodiment.

FIG. 5 is a plan view showing a prescribed part of the layout of a silicon wafer (or a semiconductor wafer) in accordance with a first modification of the first embodiment, wherein parts identical to those shown in FIG. 2 are designated by the same reference numerals and detailed description thereof is omitted. The first modification is characterized by a pattern 41 realized by a reverse V-shaped alignment of micro patterns 41a. Compared with the aforementioned pattern 26 (see FIG. 2) in which a plurality of rectangular micro patterns 26a are aligned in a reverse V-shape in a plan view, the pattern 41 is constituted by a plurality of spot-like micro patterns 41a, each having a small diameter, which are aligned in a reverse V-shape in a plan view.

The inspection for the silicon wafer of the first modification is performed similarly to for the aforementioned silicon wafer, wherein by observing the overall shape of the micro patterns 41a in the space defined between the elongated patterns 26b, it is possible to perform evaluation as to whether or not dicing is being performed well with respect to the scribing line 24. That is, the inspection does not require a skilled worker, and it is possible to visually make a determination as to whether or not dicing is being performed well with respect to the scribing line 24. This brings an improvement in workability in manufacture and reduces manufacturing cost.

(b) Second Modification

Figure 6:
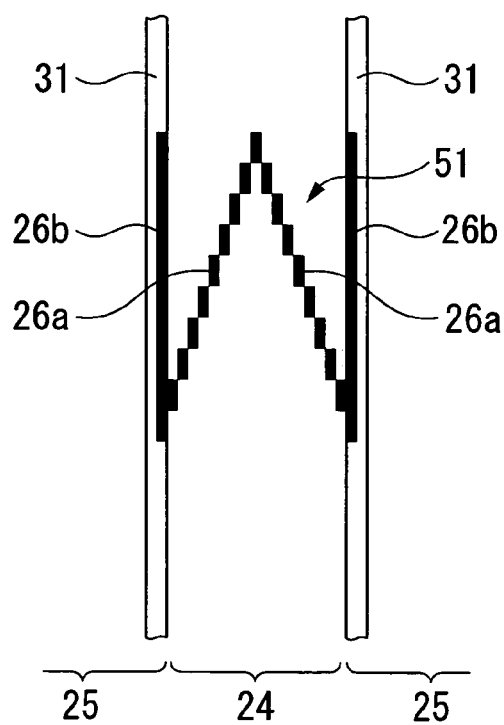
FIG. 6 is a plan view showing a prescribed part of the layout of a silicon wafer in accordance with a second modification of the first embodiment.

FIG. 6 is a plan view showing a prescribed part of the layout of a silicon wafer (or a semiconductor wafer) in accordance with a second modification, wherein parts identical to those shown in FIG. 2 are designated by the same reference numerals and detailed description thereof is omitted. The second modification is characterized by a pattern 51 realized by a reverse V-shaped alignment of micro patterns 26a. Compared with the aforementioned pattern 26 in which a plurality of rectangular micro patterns 26a are aligned in a reverse V-shape in a plan view to traverse the scribing line 24, the pattern 51 is constituted by a plurality of rectangular micro patterns 26a that are aligned in a reverse V-shape in a plan view within the space of the scribing line 24.

The inspection for the silicon wafer of the second modification is performed similarly to for the aforementioned silicon wafer, wherein it is possible to perform evaluation as to whether or not dicing is performed well with respect to the scribing line 24.

That is, when the silicon wafer of the second modification is subjected to dicing by use of a cutting tool such as a dicing blade along the scribing line 24, the center portion of the pattern 51 is cut out so that some of the micro patterns 26a remain on both sides of the dicing line 32, which is basically similar to with the first embodiment (see FIGS. 4A to 4C).

Figure 7A:
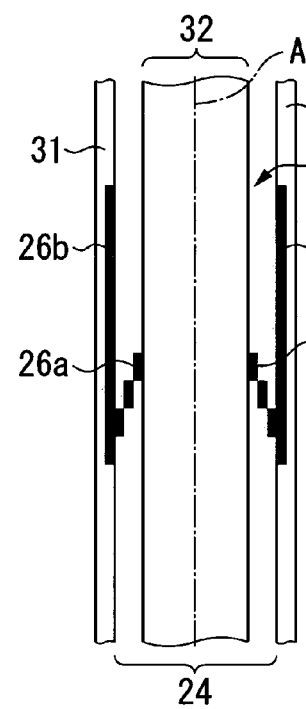
FIG. 7A shows an example of dicing in which micro patterns are left over symmetrically with respect to a dicing line in the second modification.

Suppose that as shown in FIG. 7A, the micro patterns 26a remain in a shape symmetrical with respect to the dicing line 32, wherein the center axis Ax' of the dicing line 32 substantially matches the center axis Ax of the scribing line 24.

Figure 7B:
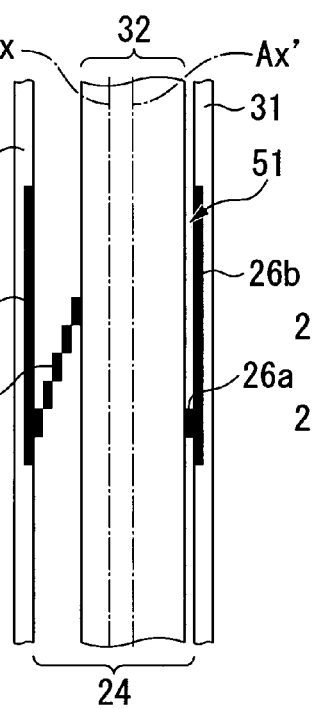
FIG. 7B shows another example of dicing in which micro patterns are left over asymmetrically with respect to a dicing line in the second modification.

Suppose that the micro patterns 26a remain in a shape as shown in FIG. 7B, wherein the center axis Ax' of the dicing line 32 deviates from the center axis Ax of the scribing line 24 with a positional shift s therebetween.

Figure 7C:
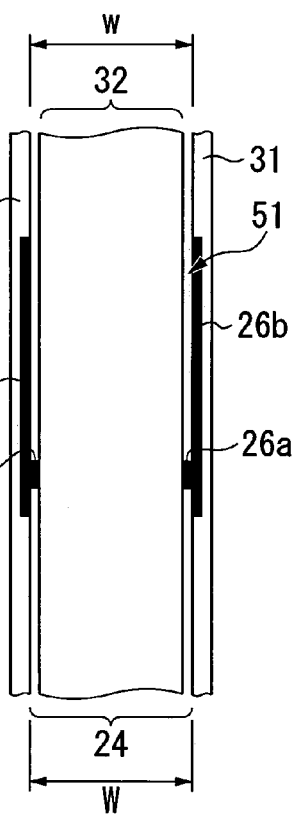
FIG. 7C shows a further example of dicing in which micro patterns are left over symmetrically with respect to a dicing line with very small distances apart from seal rings in the second modification.

Suppose that the micro patterns 26a remain in a shape as shown in FIG. 7C, wherein very small distances lie between the side ends of the dicing line 32 and the seal rings 31 respectively; in this case, the width w of the dicing line 32 becomes slightly smaller than the width W of the scribing line 24.

Similarly to in the inspection performed in the first embodiment, the silicon wafer of the second modification is subjected to inspection, in which by simply observing the overall shape of the micro patterns 26a remaining on both sides of the dicing line 32, it is possible to visually make determination as to whether or not dicing is being performed well with respect to the scribing line 24. That is, it is possible to speedily and easily make a determination as to whether or not dicing is being performed well. This brings an improvement in workability in manufacture and reduces manufacturing cost.

Since the second modification is designed such that the pattern 51 is formed within the space of the scribing line 24, inspection can be performed after the silicon wafer is divided into individual chips.

(c) Third Modification

Figure 8:
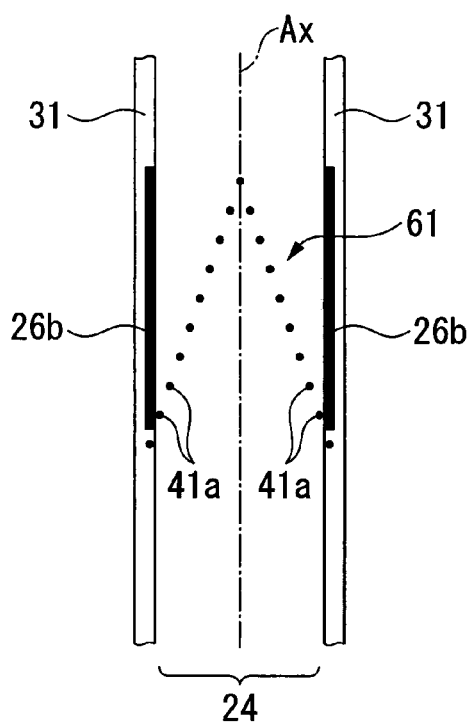
FIG. 8 is a plan view showing a prescribed part of the layout of a silicon wafer in accordance with a third modification of the first embodiment.
Figure 9:
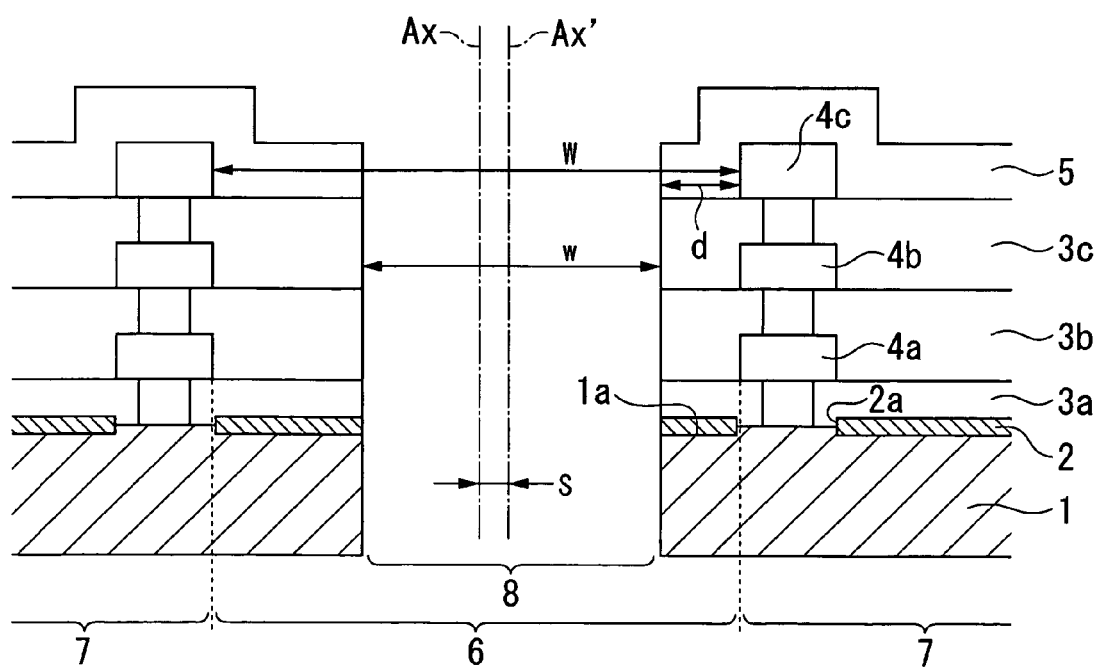
FIG. 9 is a cross-sectional view showing the structure of a conventionally-known semiconductor wafer in proximity to a dicing line after dicing.
Figure 10:
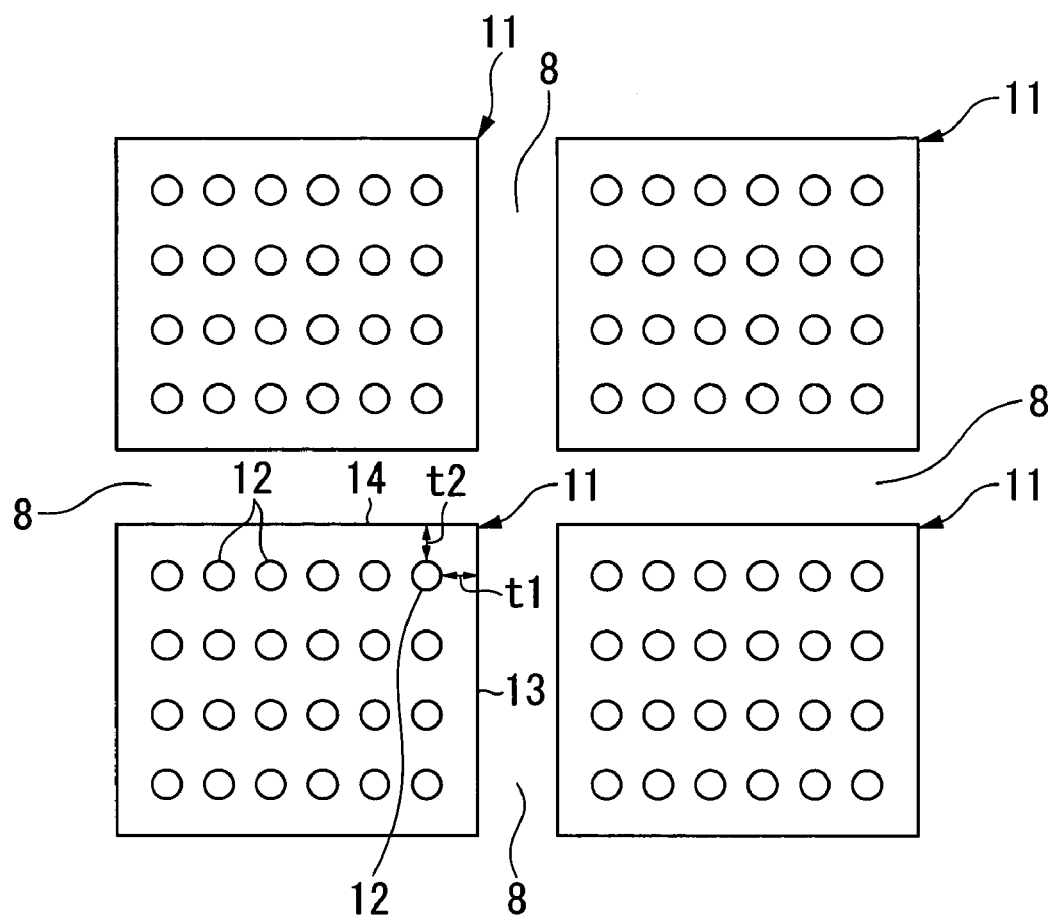
FIG. 10 is a plan view showing the layout of semiconductor devices formed on the conventionally-known semiconductor wafer after dicing.

FIG. 8 is a plan view showing a prescribed part of the layout of a silicon wafer (or a semiconductor wafer) in accordance with a third modification of the first embodiment, wherein parts identical to those shown in FIG. 5 are designated by the same reference numerals and detailed description thereof is omitted. The third modification is characterized by a pattern 61 realized by a reverse V-shaped alignment of micro patterns 41a. Compared with the pattern 51 used in the second modification (see FIG. 6) in which a plurality of rectangular micro patterns 26a are aligned in a reverse V-shape in a plan view, the pattern 61 is constituted by a plurality of spot-like micro patterns 41a, each having a small diameter, which are aligned in a reverse V-shape in a plan view within the space of the scribing line 24.

Similarly to in the inspection performed on the silicon wafer of the second modification, the inspection is performed in the third modification in such a way that by observing the overall shape of the micro patterns 41a in the space defined between the elongated patterns 26b, it is possible to perform evaluation as to whether or not dicing is performed well with respect to the scribing line 24. The inspection does not require a skilled worker; and it is possible to visually make a determination as to whether or not dicing is being performed well with respect to the scribing line 24. This brings an improvement in workability in manufacture and reduces manufacturing cost.

As described above, the first embodiment and its modifications are characterized in that the patterns 26, 27, 41, 51, and 61 are appropriately formed at prescribed positions in proximity to peripheral portions of the main surface 21a of the silicon substrate 21 and are used to measure the width w of the cut region, which is formed due to cutting of the silicon substrate 21 along the scribing line 24, and its positional shift s. Therefore, the first embodiment is applicable not only to chip size packages but also to other types of packages encapsulating semiconductor chips; hence, it may bring great industrial effects in manufacturing.

2. Second Embodiment

A semiconductor device and a wafer level chip size package (WLCSP) thereof will be described in accordance with a second embodiment of the present invention.

FIG. 11 is a cross-sectional view showing a silicon wafer (or a semiconductor wafer) for use in manufacturing of a wafer level chip size package in accordance with the second embodiment of the present invention, wherein reference numeral 121 designates a silicon substrate (or a semiconductor substrate); reference numeral 122 designates a scribing region that is formed on a main surface 121a of the silicon substrate 121; reference numerals 123 designate integrated circuit forming regions defined by the scribing region 122 on the main surface 121a of the silicon substrate 121; reference numerals 124 designate integrated circuits formed in the integrated circuit forming regions 123 respectively; reference numeral 125 designates a resin sealing layer for entirely covering the main surface 121a including the integrated circuits 124; and reference numeral 126 designates a channel that is formed at a prescribed position on a backside 121b of the silicon substrate 121 in correspondence with the scribing region 122 and that has a relatively large width, which is larger than the width of the scribing region 122.

In actuality, rewiring layers, copper posts, and bump electrodes are formed on the integrated circuits 124 on the silicon wafer; for the sake of convenience, they are not specifically described or illustrated in FIG. 11.

It is preferable that a width W of the channel 126 be larger than the width of a cut channel, which is formed in the scribing region 122 when the silicon wafer is subjected to cutting using a cutting tool such as a dicing blade, by a prescribed factor, which is 1.2 times or more, and preferably which is 1.4 times or less. Preferably, this factor is 1.22 times or more and 1.33 times or less, further preferably, it is 1.28 times.

When a width w of the cut channel ranges from 25 μm to 83 μm, the width W of the channel 126 ranges from 35 μm to 100 μm. Preferably, when the width w of the cut channel ranges from 30 μm to 45 μm, the width W of the channel 126 ranges from 40 μm to 55 μm. Further preferably, when the width w of the cut channel is 35 μm, the width W of the channel 126 is 45 μm. The width of the scribing region 122 is determined by adding a positional shift of the dicing blade to the width w of the cut channel and is thus approximately set to 120 μm.

The reason why the width W of the channel 126 is limited as described above will be described below.

When the width W of the channel 126 is less than 1.2 times the width w of the cut channel, there is a possibility that it cannot absorb the positional shift of the dicing blade. When the width W of the channel 126 exceeds 1.4 times the width w of the cut channel, there occurs a problem regarding strength and rigidity, and there occurs an effect in which the channel 126 may have its horizontal lines interfered with.

It is required that a maximal depth D of the channel 126 ranges from 20% to 70% compared with a thickness t of the silicon substrate 121. Preferably, the maximal depth D ranges from 30% to 60% compared with the thickness t of the silicon substrate 121. Further preferably, it is set to 50% of the thickness t.

The reason why the maximal depth D of the channel 126 is limited as described above will be described below.

When the maximal depth D of the channel 126 is less than 20% of the thickness t, substantially no technical effect may occur due to the provision of the channel 126. When the maximal depth D of the channel 126 exceeds 70% of the thickness t, the silicon wafer as a whole may become insufficient in terms of strength or rigidity.

Next, a manufacturing method of the wafer level chip size package of the second embodiment will be described, wherein the silicon wafer is subjected to cutting using a dicing blade, by which a cut region having a width w is formed in a scribing region 122.

As shown in FIG. 12A, in the normal process of manufacturing a wafer level chip size package, integrated circuits 124 are respectively formed in integrated circuit forming regions 123 defined by a scribing region 122 on a main surface 121a of a silicon substrate 121.

Next, as shown in FIG. 12B, by use of a dicing blade 131 whose thickness is greater than the width w of the cut channel formed in the scribing region 122, a channel 126 is formed at a prescribed position on a backside 121b of the silicon substrate 121 in correspondence with the scribing region 122.

In the above, there is estimated an allowance (or a margin) ranging from 5 μm to 25 μm, preferably, an allowance (or a margin) of 15 μm or more, with respect to both sides in the thickness direction of a dicing blade 134, which will be described later.

That is, when the width w of the cut channel ranges from 25 μm to 83 μm, the thickness of the dicing blade 131 correspondingly ranges from 35 μm to 100 μm. Preferably, when the width w of the cut channel ranges from 30 μm to 45 μm, the thickness of the dicing blade 131 correspondingly ranges from 40 μm to 55 μm. Further preferably, when the width w of the cut channel is 35 μm, the thickness of the dicing blade 131 is correspondingly set to 45 μm.

The rotating speed of the dicing blade 131 may range from 20000 to 60000 rotations per minute; preferably, it is set to 30000 rotations per minute.

The cutting speed may range from 30 mm to 70 mm per second with respect to the silicon substrate 121; preferably, it is set to 40 mm per second.

Thus, it is possible to form the channel 126 whose width is larger than the width w of the cut channel that is formed in the scribing region 122.

Next, the backside 121b of the silicon substrate 121 is subjected to polishing (or grinding) using a tool such as a grinder.

For example, the rotating speed of the grinder may range from 4000 to 8000 per minute; and preferably, it is set to 5000 per minute. In addition, the grinding speed may range from 200 μm to 450 μm with respect to the backside 121b of the silicon substrate 121; and preferably, it is set to 225 μm.

Thus, it is possible to cut out burrs that are formed during the formation of the channel 126 by use of the dicing blade 131; hence, it is possible to make the backside 121b of the silicon substrate 121 planar to a certain degree of planarity.

Next, as shown in FIG. 12C, liquid insulating resin 132 is applied over the entirety of the main surface 121a of the silicon substrate 121 including the integrated circuits 124. Then, the insulating resin 132 is subjected to ultraviolet radiation (UV) 133 and is thus hardened, thus forming a resin sealing layer 125. In consideration of workability, it may be preferable to use a two-part resin such as epoxy resin and polyimide resin; however, it is possible to use a one-part resin as necessary.

Next, the resin sealing layer 125 is subjected to chemical-mechanical polishing (CMP) so as to expose surfaces of copper posts (not shown) thereon.

Next, as shown in FIG. 12D, by use of a dicing blade 134 whose thickness matches the width w of a cut channel 135, the resin sealing layer 125 and the silicon substrate 121 are subjected to cutting along the scribing line 122, the width of which is approximately set to 120 μm.

As shown in FIG. 12D, even when the dicing blade 134 deviates by a positional shift d' (approximately, 10 μm) within the range of the width of the channel 126, it is possible to continuously perform cutting using the dicing blade 134. When the bottom of the cut channel 135 becomes deeper to reach the channel 126, there is no possibility that chipping, cracks, or burrs occur in a cut surface of the silicon substrate 121 interconnecting between the cut channel 135 and the channel 126.

Figure 13:
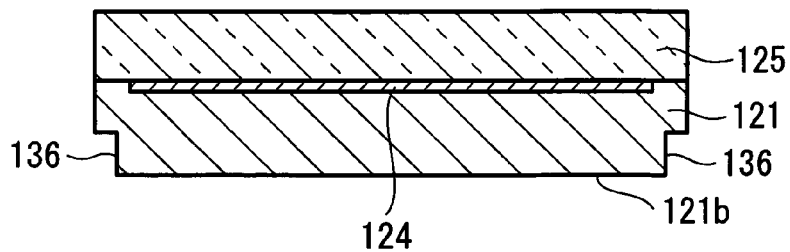
FIG. 13 is a cross-sectional view diagrammatically showing the structure of the wafer level chip size package having cutouts in connection with the channel.

FIG. 13 is a cross-sectional view showing a wafer level chip size package (WLCSP) that is produced as described above, wherein cutouts 136 having rectangular shapes in cross section, which partially contribute to the formation of the channel 126, are in the periphery of the backside 121b of the silicon substrate 121.

None of chipping, cracks, and burrs occurs in the cutout 136 irrespective of cutting using the dicing blade 134.

In short, it is possible to reliably produce a wafer level chip size package (WLCSP) not having chipping, cracks, or burrs in the cut surface of the silicon substrate 121. Hence, it is possible to produce wafer level chip size packages with high yield and with high reliability.

As described above, in the silicon wafer of the second embodiment, the channel 126 whose width is larger than the width of the scribing region 122 is formed at a prescribed position on the backside 121b of the silicon substrate 121 in correspondence with the scribing region 122. Even when the scribing region 122 is subjected to cutting using the dicing blade 134 with a positional shift d', it is possible to bring the positional shift d' into the preferable range of the width of the channel 126; hence, it is possible to reliably produce a wafer level chip size package not having chipping, cracks, or burrs in the cut surface of the silicon substrate 121. As a result, it is possible to produce wafer level chip size packages with high yield and with high reliability.

The second embodiment can be modified in a variety of ways; hence, modifications will be described below.

(a) First Modification

Figure 14:
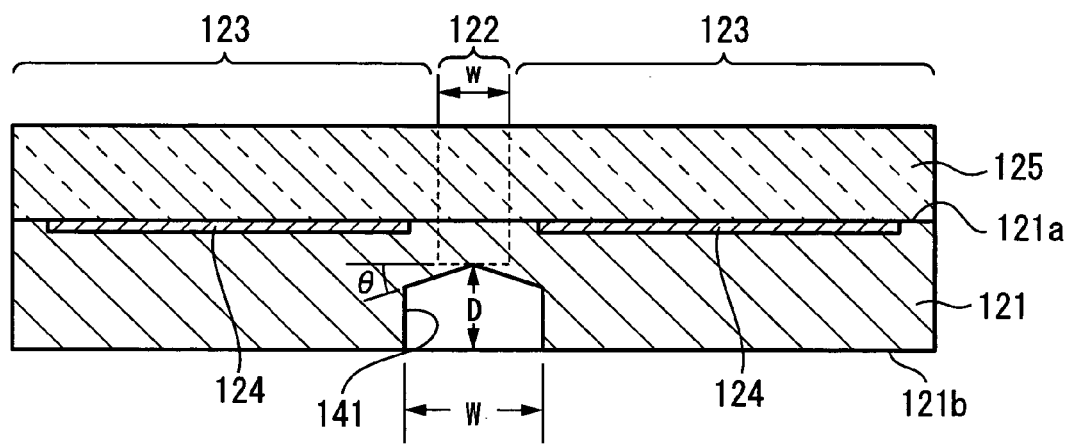
FIG. 14 is a cross-sectional view showing the structure of a silicon wafer in accordance with a first modification of the second embodiment of the present invention.

FIG. 14 is a cross-sectional view showing the structure of a silicon wafer (or a semiconductor wafer) that is used for manufacturing a wafer level chip size package in accordance with a first modification of the second embodiment of the present invention. Compared with the foregoing silicon wafer shown in FIG. 11 in which the channel 126 has a planar bottom, the silicon wafer of the first modification is designed such that a channel 141 has a V-shaped bottom in a cross section is formed, in which the center of the bottom has a maximal depth D.

The relationship between the width W and the depth D of the channel 141 are identical to the relationship between the width W and the depth D of the channel 126. In addition, the V-shaped bottom of the channel 141 has an inclination angle θ ranging from 30° to 60°. Preferably, the inclination angle ranges from 40° to 50°; further preferably, it is set to 45°.

Figure 15:
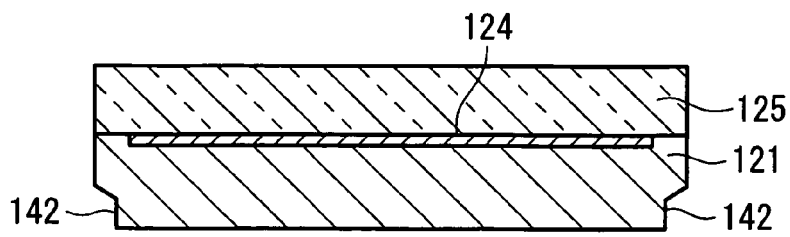
FIG. 15 is a cross-sectional view showing the structure of a wafer level chip size package that is produced using the silicon wafer shown in FIG. 14.

FIG. 15 is a cross-sectional view showing the structure of the wafer level chip size package that is produced using the aforementioned silicon wafer shown in FIG. 14, wherein trapezoidal cutouts 142, which partially contribute to the formation of the channel 141, are formed in the periphery of the backside 121b of the silicon substrate 121. Each of the cutouts 142 has an inclination angle that matches the inclination angle θ of the bottom of the channel 141.

This wafer level chip size package can be produced similarly to the foregoing wafer level chip size package shown in FIG. 13.

Specifically, the backside 121b of the silicon substrate 121 is subjected to cutting using a dicing blade whose edge is shaped complementary to the bottom of the channel 141, in other words, which has a projection shape (or a reverse V-shape), so that the V-shaped channel 141 can be reliably formed at a prescribed position on the backside 121b of the silicon substrate 121 in correspondence with the scribing region 122.

The first modification can demonstrate prescribed operation and effects identical to those of the second embodiment. Incidentally, the V-shaped channel 141 can be replaced with a U-shaped channel (i.e., a channel having a U-shape in a cross section), wherein it is possible to demonstrate prescribed operation and effects as well.

(b) Second Modification

Figure 16:
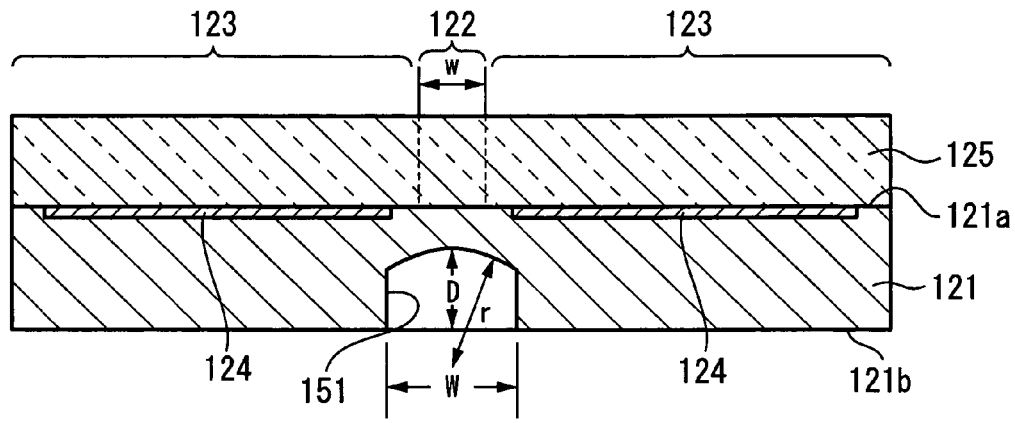
FIG. 16 is a cross-sectional view showing the structure of a silicon wafer in accordance with a second modification of the second embodiment of the present invention.

FIG. 16 is a cross-sectional view showing the structure of a silicon wafer (or a semiconductor wafer) that is used to manufacture a wafer level chip size package in accordance with a second modification of the second embodiment of the present invention. Compared with the foregoing silicon wafer shown in FIG. 11 in which the channel 126 has a planar bottom, the silicon wafer shown in FIG. 16 is designed such that a channel 151 has a semi-circular shape bottom in a cross section, in which the center of the bottom has a maximal depth D.

The relationship between the width W and the depth D of the channel 151 is identical to the relationship between the width W and the depth D of the channel 126.

A radius of curvature r of the bottom of the channel 151 ranges from 30 μm to 250 μm. Preferably, the radius of curvature r ranges from 100 μm to 150 μm; further preferably, it is set to 125 μm.

Figure 17:
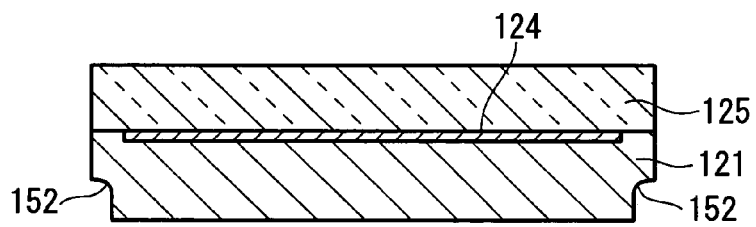
FIG. 17 is a cross-sectional view showing the structure of a wafer level chip size package that is produced using the silicon wafer shown in FIG. 16.
Figure 18:
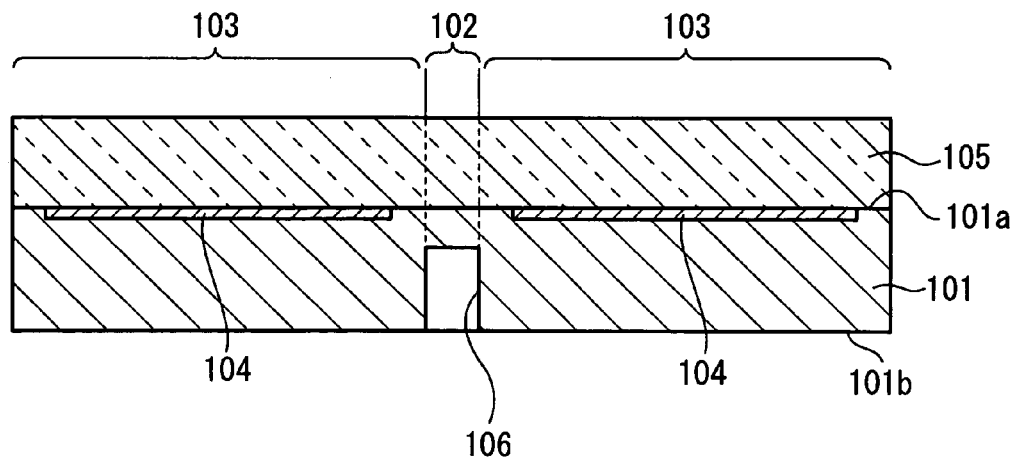
FIG. 18 is a cross-sectional view showing the structure of a silicon wafer that is conventionally known.
Figure 19:
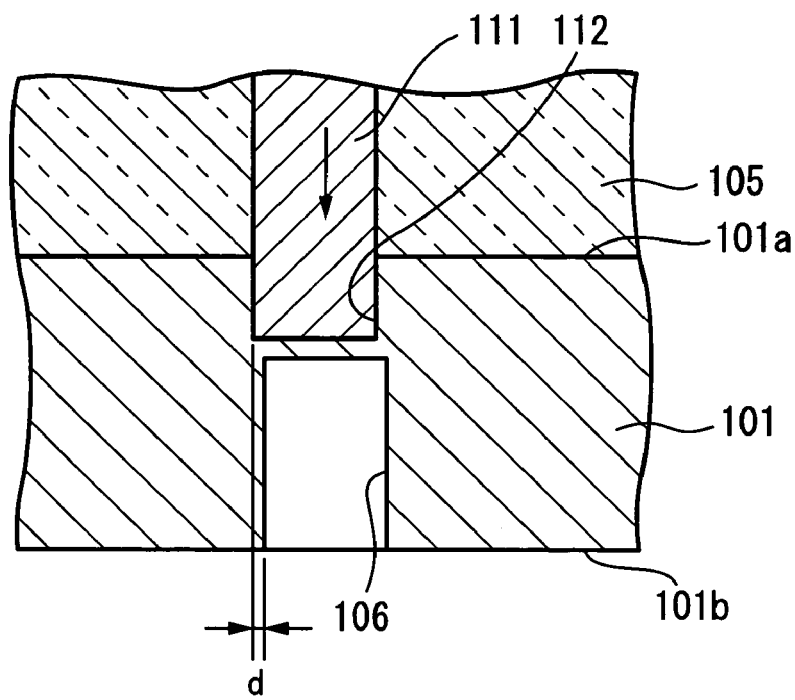
FIG. 19 is a cross-sectional view showing the structure of the silicon wafer of FIG. 18 that is subjected to cutting using a dicing blade.
Figure 20A:
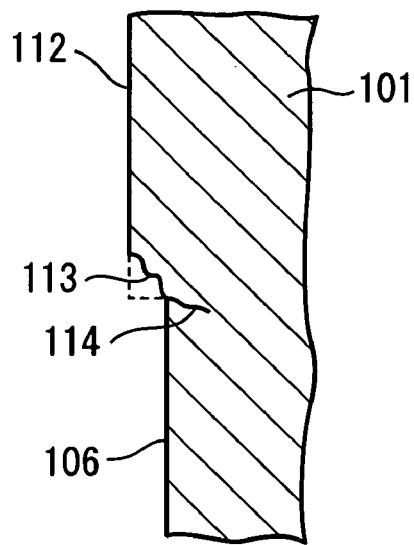
FIG. 20A is an enlarged cross-sectional view showing the occurrence of chipping and cracks in the silicon wafer of FIG. 18 due to dicing.
Figure 20B:
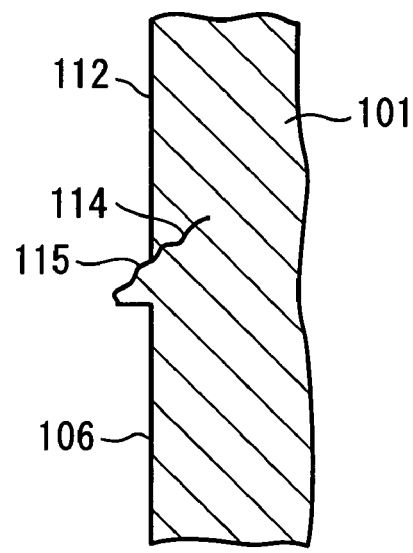
FIG. 20B is an enlarged cross-sectional view showing the occurrence of cracks and burrs in the silicon wafer of FIG. 18 due to dicing.

FIG. 17 is a cross-sectional view showing the wafer level chip size package that is produced using the silicon wafer shown in FIG. 16, wherein semi-circular cutouts 152, which partially contribute to the formation of the channel 151, are formed in the periphery of the backside 121b of the silicon substrate 121.

Each of the cutouts 152 has a radius of curvature that matches the radius of curvature r in the bottom of the channel 151.

This wafer level chip size package can be manufactured similarly to the foregoing wafer level chip size package shown in FIG. 11.

Specifically, the backside 121b of the silicon substrate 121 is subjected to cutting using a dicing blade whose edge is shaped complementary to the bottom of the channel 151, so that the V-shaped channel 151 can be reliably formed at a prescribed position on the backside 121b of the silicon substrate 121 in correspondence with the scribing region 122.

The second modification can demonstrate prescribed operation and effects identical to those of the second embodiment.

As described above, the second embodiment and its modifications are designed such that the channels 126, 141, and 151 having relatively large widths greater than the widths of the scribing regions 122 are formed at prescribed positions on the backside 121b of the silicon substrate 121 in correspondence with the scribing regions 122. Therefore, the second embodiment is applicable not only to wafer level chip size packages but also to other types of packages such as chip size packages encapsulating semiconductor chips; hence, it may bring great industrial effects in manufacturing.

Lastly, the present invention is not necessarily limited to the aforementioned embodiments and modifications, which are illustrative and not restrictive; hence, it is possible to provide design changes and further modifications within the scope of the invention defined by the appended claims.

What is claimed is:

1. A semiconductor wafer in which a main surface of a semiconductor substrate is partitioned into a plurality of semiconductor element forming regions defined by scribing regions, said semiconductor wafer comprising at least one pattern for measuring a width of a cut region and its positional shift when the semiconductor substrate is subjected to cutting along the scribing regions, wherein the pattern designates a center position and edge positions of the scribing regions in a width direction.

2. A semiconductor wafer according to claim 1, wherein the pattern represents a linearly symmetrical figure.

3. A semiconductor wafer according to claim 1, wherein the pattern is formed in proximity to a peripheral portion of the main surface of the semiconductor substrate.

4. A semiconductor wafer according to claim 1, wherein the pattern is formed in proximity to a peripheral portion of the main surface of the semiconductor substrate and extends over the scribing region.

5. The semiconductor wafer according to claim 1, wherein the pattern is constituted of a plurality of micro patterns, which are formed in a V-shape in plan view.

6. The semiconductor wafer according to claim 5, wherein the micro patterns are rectangular micro patterns or spot-like micro patterns.

7. The semiconductor wafer according to claim 1, further comprising a pair of band-like elongated patterns formed at both sides of the scribe region.

8. The semiconductor wafer according to claim 1, wherein the pattern comprises two strings of micro patterns crossing each other at tip end position, which matches a center axis of the scribe region.

9. A semiconductor device including a semiconductor element forming region that is produced by cutting a semiconductor substrate along scribing regions on a semiconductor wafer, which has at least one pattern for measuring a width of a cut region and its positional shift, wherein the pattern designates a center position and edge positions of the scribing regions in a width direction.

10. A chip size package encapsulating a semiconductor element forming region that is produced by cutting a semiconductor substrate along scribing regions on a semiconductor wafer, which has at least one pattern for measuring a width of a cut region and its positional shift, wherein the pattern designates a center position and edge positions of the scribing regions in a width direction.

11. A chip size package according to claim 10, wherein the pattern represents a linearly symmetrical figure.

12. A chip size package according to claim 10, wherein the pattern is formed in proximity to a peripheral portion of the main surface of the semiconductor substrate.

13. A manufacturing method for a semiconductor wafer in which a main surface of a semiconductor substrate is partitioned into a plurality of semiconductor element forming regions defined by scribing regions, said manufacturing method comprising a pattern forming step of forming a pattern that is used to measure a width of a cut region and its positional shift when the semiconductor substrate is subjected to cutting along the scribing regions, wherein the pattern forming step is implemented during or after a semiconductor element forming step for forming semiconductor elements in the semiconductor element forming regions on the semiconductor wafer, wherein the pattern designates a center position and edge positions of the scribing regions in a width direction.

14. The manufacturing method for a semiconductor wafer according to claim 13, wherein the semiconductor element forming step includes an external terminal forming step for forming external terminals, which are electrically connected to the semiconductor elements, and wherein the pattern forming step is performed simultaneously with the external terminal forming step.

15. An inspection method for a semiconductor wafer in which a main surface of a semiconductor substrate is partitioned into a plurality of semiconductor element forming regions defined by scribing regions and which has at least one pattern for measuring a width of a cut region and its positional shift, said inspection method comprising the step of observing variations of the pattern before and after dicing along the scribing regions, based on which an evaluation is performed as to whether or not the dicing is being performed well.

16. A semiconductor wafer in which a plurality of integrated circuit forming regions defined by scribing regions are formed on a main surface of a semiconductor substrate and are covered with a sealing layer, wherein a channel whose width is larger than a width of the scribing region is formed at a prescribed position in correspondence with the scribing region on a backside of the semiconductor substrate.

17. A semiconductor wafer according to claim 16, wherein the channel has a V-shaped bottom, a U-shaped bottom, or a bottom of a semi-circular shape in a cross section in a longitudinal direction.

18. A semiconductor wafer according to claim 16, wherein the width of the channel is larger than a width of a cut channel, which is formed in the scribing region in a cutting step, by a prescribed factor, which is 1.2 times or more and 1.4 times or less compared with the width of the cut channel.

19. A semiconductor wafer according to claim 16, wherein the maximal depth of the bottom of the channel is smaller than a thickness of the semiconductor substrate by a prescribed factor, which ranges from 20% to 70% compared with the thickness of the semiconductor substrate.

20. A semiconductor device that is produced using a semiconductor wafer in which a plurality of integrated circuit forming regions defined by scribing regions are formed on a main surface of a semiconductor substrate and are covered with a sealing layer, wherein a channel whose width is larger than a width of the scribing region is formed at a prescribed position in correspondence with the scribing region on a backside of the semiconductor substrate, and wherein the sealing layer and the semiconductor substrate are subjected to cutting along the scribing lines.

21. A semiconductor device according to claim 20, wherein the semiconductor device includes a cutout section corresponding to a portion of the channel, the cutout section having a trapezoidal shape in a cross section in a longitudinal direction.

22. A semiconductor device according to claim 20, wherein the semiconductor device includes a cutout section corresponding to a portion of the channel, the cutout section having a rectangular shape in a cross section in a longitudinal direction.

23. A semiconductor device according to claim 20, wherein the semiconductor device includes a cutout section corresponding to a portion, a portion of the cutout section having a shape with a radius of curvature in a cross section in a longitudinal direction.

24. A wafer level chip size package that is produced using a semiconductor wafer in which a plurality of integrated circuit forming regions defined by scribing regions are formed on a main surface of a semiconductor substrate and are covered with a sealing layer, wherein a channel whose width is larger than a width of the scribing region is formed at a prescribed position in correspondence with the scribing region on a backside of the semiconductor substrate, and wherein the sealing layer and the semiconductor substrate are subjected to cutting along the scribing lines.

25. A wafer level chip size package according to claim 24, wherein the semiconductor device includes a cutout section corresponding to a portion of the channel, the cutout section having a trapezoidal shape in a cross section in a longitudinal direction.

26. A wafer level chip size package according to claim 24 wherein the semiconductor device includes a cutout section corresponding to a portion of the channel, the cutout section having a rectangular shape in a cross section in a longitudinal direction.

27. A wafer level chip size package according to claim 24, wherein the semiconductor device includes a cutout section corresponding to a portion of the channel, a portion of the cutout section having a shape with a radius of curvature in a cross section in a longitudinal direction.

28. A wafer level chip size package according to claim 24, wherein side walls of a chip are subjected to cutting with a prescribed inclination angle.

29. A manufacturing method for a semiconductor device that is produced using a semiconductor wafer in which a plurality of integrated circuit forming regions defined by scribing regions are formed on a main surface of a semiconductor substrate, said manufacturing method comprising the steps of:
forming a channel whose width is larger than a width of the scribing region at a prescribed position in correspondence with the scribing region on a backside of the semiconductor substrate;
forming a sealing layer so as to entirely cover the main surface of the semiconductor substrate, thus encapsulating the integrated circuit forming regions therein; and
cutting the semiconductor substrate and the sealing layer along the scribing regions, thus separating individual chips respectively including the integrated circuit forming regions.

30. The manufacturing method for a semiconductor device according to claim 29, wherein the channel has a V-shaped bottom, a U-shaped bottom, or a bottom of a semi-circular shape in a cross section in a longitudinal direction.

31. The manufacturing method for a semiconductor device according to claim 29, wherein the width of the channel is larger than a width of a cut channel, which is formed in the scribing region in a cutting step, by a prescribed factor, which is 1.2 times or more and 1.4 times or less compared with the width of the cut channel.

32. The manufacturing method for a semiconductor device according to claim 29, wherein a maximal depth of a bottom of the channel is smaller than a thickness of the semiconductor substrate by a prescribed factor, which ranges from 20% to 70% compared with the thickness of the semiconductor substrate.

33. The manufacturing method for a semiconductor device according to claim 29, wherein the scribing region is subjected to cutting with a prescribed inclination angle in side portions thereof.

* * * * *